(12) United States Patent
Periaman et al.

(10) Patent No.: US 7,279,795 B2
(45) Date of Patent: Oct. 9, 2007

(54) STACKED DIE SEMICONDUCTOR PACKAGE

(75) Inventors: Shanggar Periaman, Penang (MY); Kooi Chi Ooi, Penang (MY)

(73) Assignee: Intel Corporation, Santa Clara, CA (US)

( * ) Notice: Subject to any disclaimer, the term of this patent is extended or adjusted under 35 U.S.C. 154(b) by 24 days.

(21) Appl. No.: 11/321,669

(22) Filed: Dec. 29, 2005

(65) Prior Publication Data

US 2007/0152313 A1  Jul. 5, 2007

(51) Int. Cl.
*H01L 23/48*  (2006.01)
(52) U.S. Cl. .................. 257/777; 257/772; 257/779; 257/781
(58) Field of Classification Search .......... 257/678, 257/772, 777–782, 787, 795
See application file for complete search history.

(56) References Cited

U.S. PATENT DOCUMENTS

| | | | |
|---|---|---|---|
| 6,177,732 B1 | 1/2001 | Zu | 257/781 |
| 6,255,899 B1* | 7/2001 | Bertin et al. | 327/564 |
| 6,294,406 B1* | 9/2001 | Bertin et al. | 438/109 |
| 6,600,222 B1 | 7/2003 | Levardo | 257/686 |
| 6,645,832 B2 | 11/2003 | Kim et al. | 438/456 |
| 6,657,275 B1 | 12/2003 | Chung et al. | 257/503 |
| 6,828,512 B2 | 12/2004 | Chung et al. | 174/260 |
| 6,890,798 B2 | 5/2005 | McMahon | 438/122 |
| 6,924,551 B2 | 8/2005 | Rumer et al. | 257/688 |
| 6,927,097 B2 | 8/2005 | Dunlap | 438/118 |
| 6,946,384 B2 | 9/2005 | Kloster et al. | 438/622 |
| 2003/0143971 A1 | 7/2003 | Hongo et al. | 455/313 |
| 2004/0084771 A1* | 5/2004 | Bolken et al. | 257/738 |

* cited by examiner

*Primary Examiner*—Wai-Sing Louie
(74) *Attorney, Agent, or Firm*—Trop, Pruner & Hu, P.C.

(57) ABSTRACT

In one embodiment, the present invention includes a semiconductor package including a first semiconductor die with first active circuitry and a second semiconductor die with second active circuitry. An intermediate substrate may be located in the package between the first and second semiconductor dies to provide power to at least one of the dies. In this way, improved stacking within a single package is afforded. Other embodiments are described and claimed.

15 Claims, 5 Drawing Sheets

STACKED DIE SEMICONDUCTOR PACKAGE

BACKGROUND

Embodiments of the present invention relate to integrated circuit (IC) packaging technology and more particularly to stacked die packages.

Today's ICs are manufactured with increasingly higher performance, reduced costs, and increased miniaturization of components and devices. Many ICs such as processors, controllers, logic devices, memory devices and the like may be housed in a package including a substrate which supports a semiconductor die and which further has internal electrical connections to provide interconnections (i.e., power and data) to the die. The package includes external electrical connections to enable the package to be electrically connected to, for example, a socket that may be adapted on a circuit board such as a motherboard or the like.

Thus the package may be used to provide power to the semiconductor die within the package, as well as to enable transfer of data to and from the die. Furthermore, a package provides a manner to dissipate heat from the die so that the device (e.g., a processor) therein can operate at its peak performance. Furthermore, the package protects the die from environmental damage.

Some semiconductor packages include a mixed stack of active devices. Specifically, some packages include two active die (i.e., two different semiconductor devices) that are stacked, one on top of the other, e.g., using an interface layer such as an epoxy or the like. Typically, these stacked die are memory-based devices such as flash memories. While such stacking of multiple devices can improve density of a resulting semiconductor package, certain problems exist. First, the top die in such a package may have limited availability of interconnects for power and data, as all such interconnects are typically provided to the top die using wire bonds from a substrate of the package. Because of space considerations as more functionality appears in a semiconductor device, the ability to provide sufficient power and data interconnects with wire bonds becomes difficult.

In some packages, the bottom die of a mixed stack may include multiple vias in an effort to overcome this problem of limited interconnections. In such packages, vias through the first die provide interconnections that can be directly coupled to the top die, e.g., by solder bumps that couple the top and bottom die. However, such an implementation creates thermal stress on the bottom die, as these interconnections are used to provide, in part, power to the top die.

Without stacking of die, data interconnections between active die (i.e., in different packages) typically require long interlinks through conductive layers of a circuit board, such as a motherboard. These long interconnects increase inductance and can further cause electrical noise. Furthermore, the distance of such interconnects reduces communication speed between different semiconductor devices.

DETAILED DESCRIPTION

In various embodiments, a semiconductor package may include multiple semiconductor dies. More particularly, these multiple die may be stacked on top of each other to improve packing densities, allow more total circuitry within a single semiconductor package. These multiple stacked die may each utilize significant numbers of data interconnections, i.e., input/output (I/O) interconnections. Furthermore, each die requires its own power source in the form of one or more voltages to operate circuitry on the die. To maintain and improve on packing densities while accommodating desired numbers of power and data interconnects, embodiments of the present invention may provide for the inclusion of one or more intermediate substrates within a semiconductor package. These intermediate substrates may be sandwiched between active die and may be used to provide support for the die, as well as to provide I/O and power interconnections to/from the die. In this way, I/O connections may be maximized. Furthermore, by providing interconnections between the stacked die through an intermediate substrate, longer interconnects, e.g., from separate semiconductor packages and/or through traces on a circuit board may be avoided, improving data throughput as well as avoiding capacitance and other issues related to such long interconnects.

Figure 1:
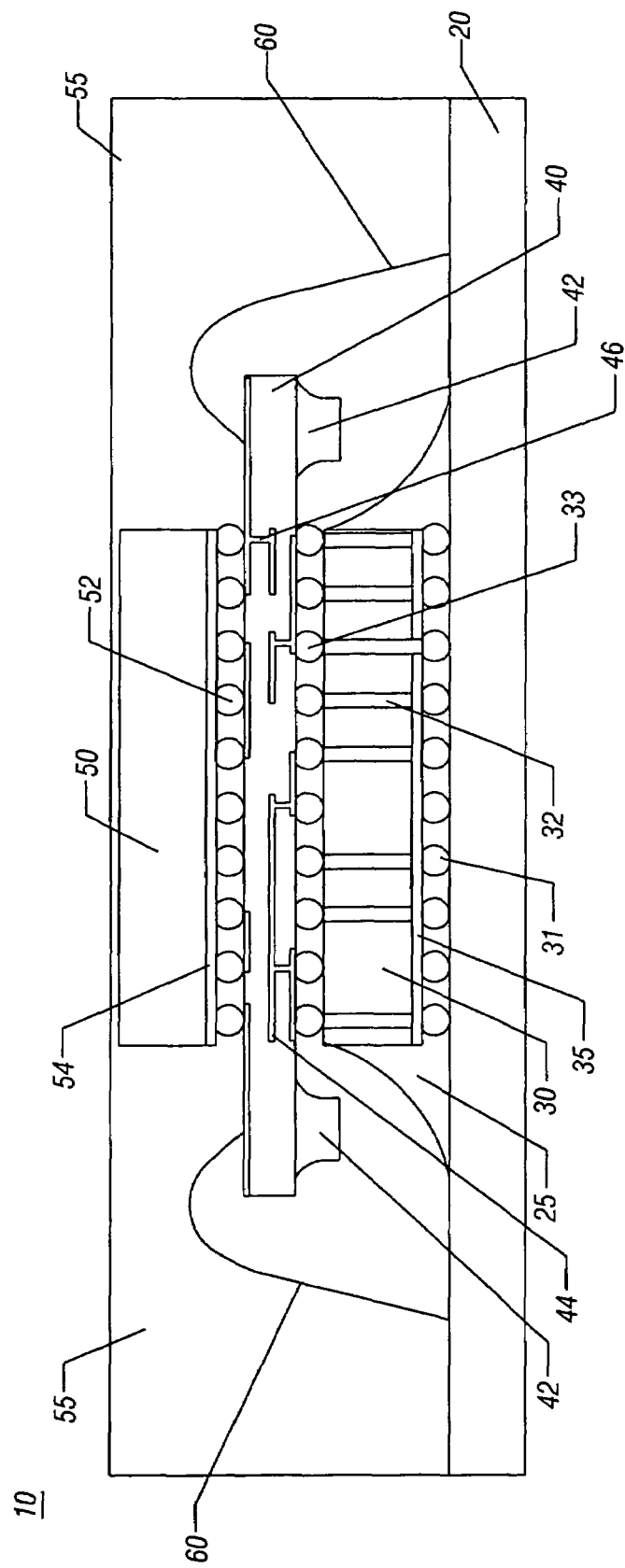
FIG. 1 is a cross-sectional view of a semiconductor package in accordance with one embodiment of the present invention.

Referring now to FIG. 1, shown is a cross-sectional view of a semiconductor package in accordance with one embodiment of the present invention. As shown in FIG. 1, package 10 is a mixed stacked die package that includes two active semiconductor die, namely a first die 30 and a second die 50 (also referred to herein as first and second active die). As will be discussed further below, an intermediate substrate 40 provides interconnections between the two active dies.

Still referring to FIG. 1, first die 30 is affixed to a substrate 20, which may be a support substrate, with electrical connections which provide for interconnection to, e.g., a socket, circuit board or the like. Specifically, as shown in FIG. 1, electrical interconnection may be effected using a plurality of solder bumps 31 which may be controlled collapse chip connect (C4) bumps, in one embodiment (many of which are shown but only one of which is enumerated for ease of illustration in FIG. 1). Further, an underfill material 25 may encapsulate these solder bumps 31 of first die 30. First active die 30 includes a plurality of vias 32, only one of which is enumerated as such in FIG. 1. In various embodiments, vias 32 may be silicon vias to provide interconnections through the die. More specifically, vias 32 may be formed during fabrication of the semiconductor die and then may be metallized to provide interconnections from active layers of first die 30 to its backside. Specifically, as shown in FIG. 1, first die 30 includes an active region 35 that includes the various circuitry of the die. Silicon vias 32 thus provide connections, either from solder bumps 31 to a backside of first die 30 or from particular circuitry within active region 35 to the backside of first die 30.

As shown in FIG. 1, vias 32 may be used to provide interconnections through the die to a second set of solder bumps 33, one of which is enumerated as such in FIG. 1. In turn, solder bumps 33 are coupled to intermediate substrate 40. Intermediate substrate 40, also referred to herein as an interface substrate, may be a passive substrate. That is, interface substrate 40 may not include any active circuitry. Instead, interface substrate 40 acts as an interconnect or interposer between first active die 30 and second active die 50. As shown in the embodiment of FIG. 1, interface substrate 40 may include various interconnections, including for example interconnect lines or horizontal interconnects 44 and interconnect vias or vertical interconnects 46. In this manner, connections may be made to desired circuitry on either of first active die 30 and second active die 50. Interface substrate 40 may be fabricated using known semiconductor processing techniques. For example, substrate 40 may be a silicon or other semiconductor substrate. Furthermore, the vias and interconnects of interface substrate 40 may be fabricated using various photolithography and deposition techniques. As such, interface substrate 40 may be formed of multiple metallized layers (each separated, for example, by a dielectric layer) on a semiconductor base or interface substrate 40 may be formed of a semiconductor base having a multilayer (for example) interconnect structure formed thereon. In any event, interface substrate 40 may lack active circuitry.

Thus, in many implementations interface substrate 40 includes no active circuitry, such as active devices, e.g., transistors or other active components. Instead, the only circuitry within interface substrate 40 is passive circuitry, such as routing interconnects for data and power. Of course, certain components may be affixed to interface substrate 40, e.g., capacitors 42 as shown in FIG. 1. In embodiments in which interface substrate 40 provides all power sources for at least second active die 50, interface substrate 40 may include one or more capacitors 42 to provide storage of power for second die 50 and/or first active die 30. However, the scope of the present invention is not so limited, and in other embodiments one or both of the active die may receive power from other sources, e.g., directly from power interconnections from substrate 20 or another location. To provide data and power interconnects, a plurality of solder bumps 52 may couple interface substrate 40 to second active die 50. More specifically, the solder bumps may couple to an active region 54 of second active die 50. As further shown in FIG. 1, multiple wire bonds 60 may be coupled from substrate 20 to interface substrate 40. Such wire bonds may provide interconnects for data, e.g., I/O interconnects as well as power interconnections. A mold compound 55 may further be present in package 10 to provide desired stiffness to package 10. Mold compound 55 may form a mold layer according to a desired molding process, e.g., injection molding or the like.

In various implementations, the stacked die of FIG. 1 may include closely-coupled semiconductor components. For example, one of the die may correspond to a processor (e.g., a central processor unit (CPU)) while the other die may correspond to a chipset, e.g., a memory controller hub (MCH) and/or an I/O controller hub (ICH) for the processor. Of course, other implementations are possible.

In one embodiment, second active die 50 may correspond to the processor, while first active die 30 may correspond to the chipset therefor. In this implementation, more efficient heat dissipation may be effected for the processor, which requires greater heat dissipation. Thus, while not shown in the embodiment of FIG. 1, it is to be understood that a thermal cover (e.g., an integrated heat spreader (IHS)) may be coupled over second die 50 and mold compound 55. In some implementations, a thermal interface material (TIM) may be sandwiched between second die 50 and the IHS. Using an interface substrate in accordance with an embodiment of the present invention, I/O connections for a semiconductor component (e.g., active die 50) may thus be maximized.

While described with this particular implementation in the embodiment of FIG. 1, is to be understood that the scope of the present invention is not so limited. For example, while shown in FIG. 1 as including multiple bumps to enable interconnections between active die and the various substrates, it is to be understood that the scope of the present invention is not so limited and in other embodiments a bumpless technology may be used to enable interconnections between the various die and intermediate or support substrates.

Figure 2:
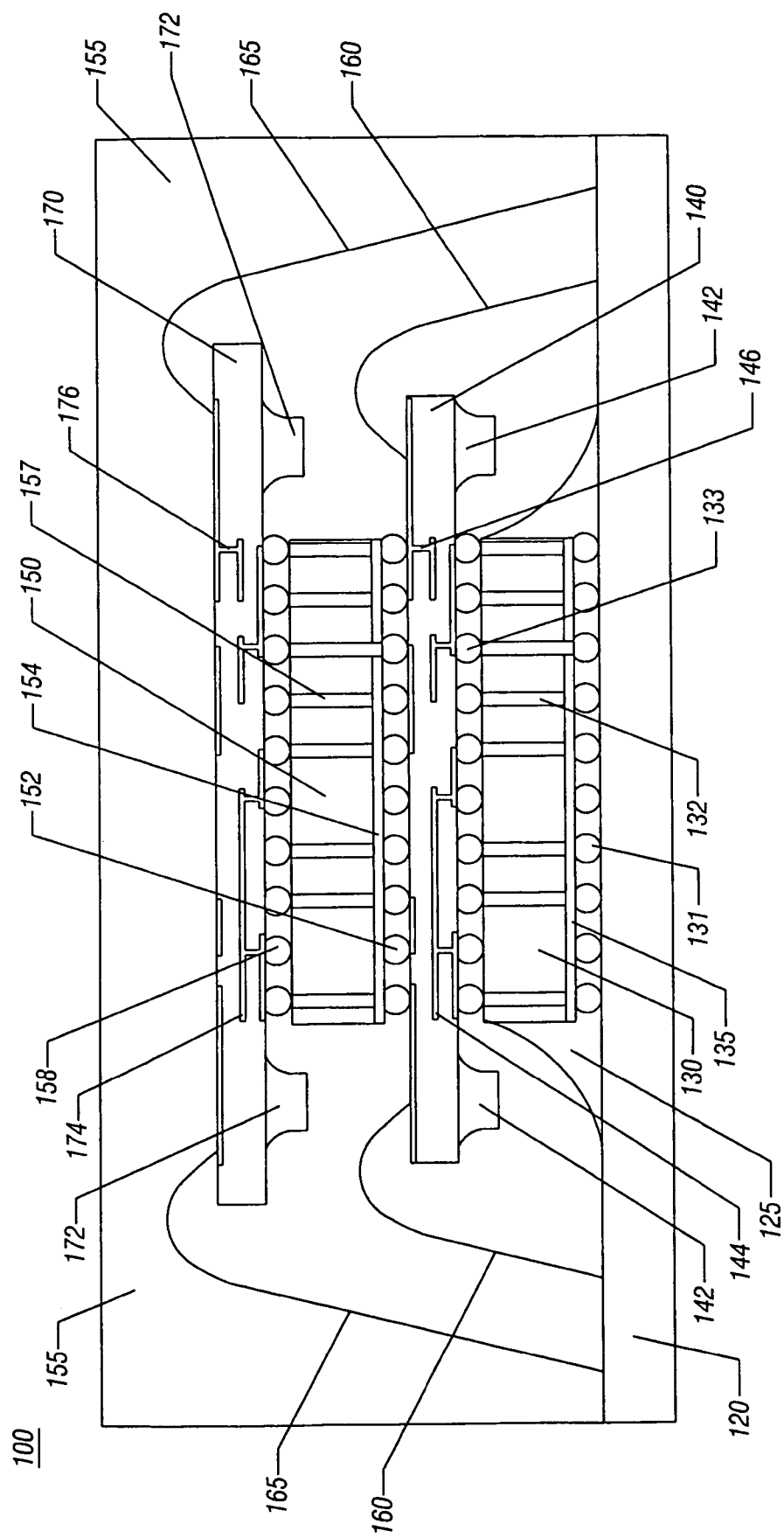
FIG. 2 is a cross-sectional view of a semiconductor package in accordance with another embodiment of the present invention.

Referring now to FIG. 2, shown is a cross-sectional view of a semiconductor package in accordance with another embodiment of the present invention. As shown in FIG. 2, semiconductor package 100 also includes mixed stacked die. In addition to the multiple die and first interface substrate shown in FIG. 1, the embodiment of FIG. 2 further includes a second interface substrate coupled above the second active die. Accordingly, as shown in FIG. 2 package 100 includes two active semiconductor die, namely a first die 130 and a second die 150 (also referred to herein as first and second active die). A first intermediate substrate 140 provides interconnections between the two active dies, while a second interface substrate 170 provides additional interconnections to second die 150.

Similar to the structure of package 10 shown in FIG. 1, package 100 of FIG. 2 includes first die 130 electrically connected to a substrate 120 by a plurality of solder bumps 131 (many of which are shown but only one of which is enumerated for ease of illustration in FIG. 2). The connection to substrate 120 is encapsulated with an underfill material 125. First die 130 includes a plurality of vias 132, only one of which is enumerated as such in FIG. 2, which may be coupled on one side to an active region 135 of first die 130 or a solder bump 131. Vias 132 further couple to a second set of solder bumps 133, one of which is enumerated as such in FIG. 2. In turn, solder bumps 133 are coupled to a first intermediate substrate 140, which may be a passive substrate, as described above. As shown in the embodiment of FIG. 2, first interface substrate 140 may include various interconnections, including interconnect lines 144 and interconnect vias 146. In this manner, connections may be made to desired circuitry on either of first die 130 and second die 150. In various embodiments, first interface substrate 140 may provide all power sources for at least second die 150. Accordingly, first interface substrate 140 may include one or more capacitors 142 to store power for second die 150 and/or first active die 130. To enable power and data interconnection, a plurality of solder bumps 152 may electrically connect first interface substrate 140 and second active die 150. More particularly, the solder bumps may be coupled to an active region 154 of second active die 150. As further shown in FIG. 2, multiple wire bonds 160 may be coupled from substrate 120 to first interface substrate 140. Such wire bonds provide interconnects for data and power. As further shown, a mold compound 155 may provide desired stiffness to package 100.

Still referring to FIG. 2, second interface substrate 170 may be coupled over second active die 150. As shown in the embodiment of FIG. 2, a plurality of solder bumps 158, only one of which is enumerated as such in FIG. 2, may be used to couple second active die 150 with second interface substrate 170. These interconnects may be effected using vias 157 of second active die 140 (many of which are shown but only one of which is enumerated as such in FIG. 2).

As shown in FIG. 2, second interface substrate 170 may include various interconnections, including horizontal lines 174 and vertical vias 176. Second interface substrate 170 may also include a plurality of capacitors 172. Furthermore, wire bonds 165 may be coupled to second interface substrate 170 from substrate 120. In this manner, maximized interconnections may be realized for second active die 150. Thus as semiconductor components increasingly include additional devices (e.g., transistors) and greater functionality, additional I/O interconnects may be accommodated.

Figure 3:
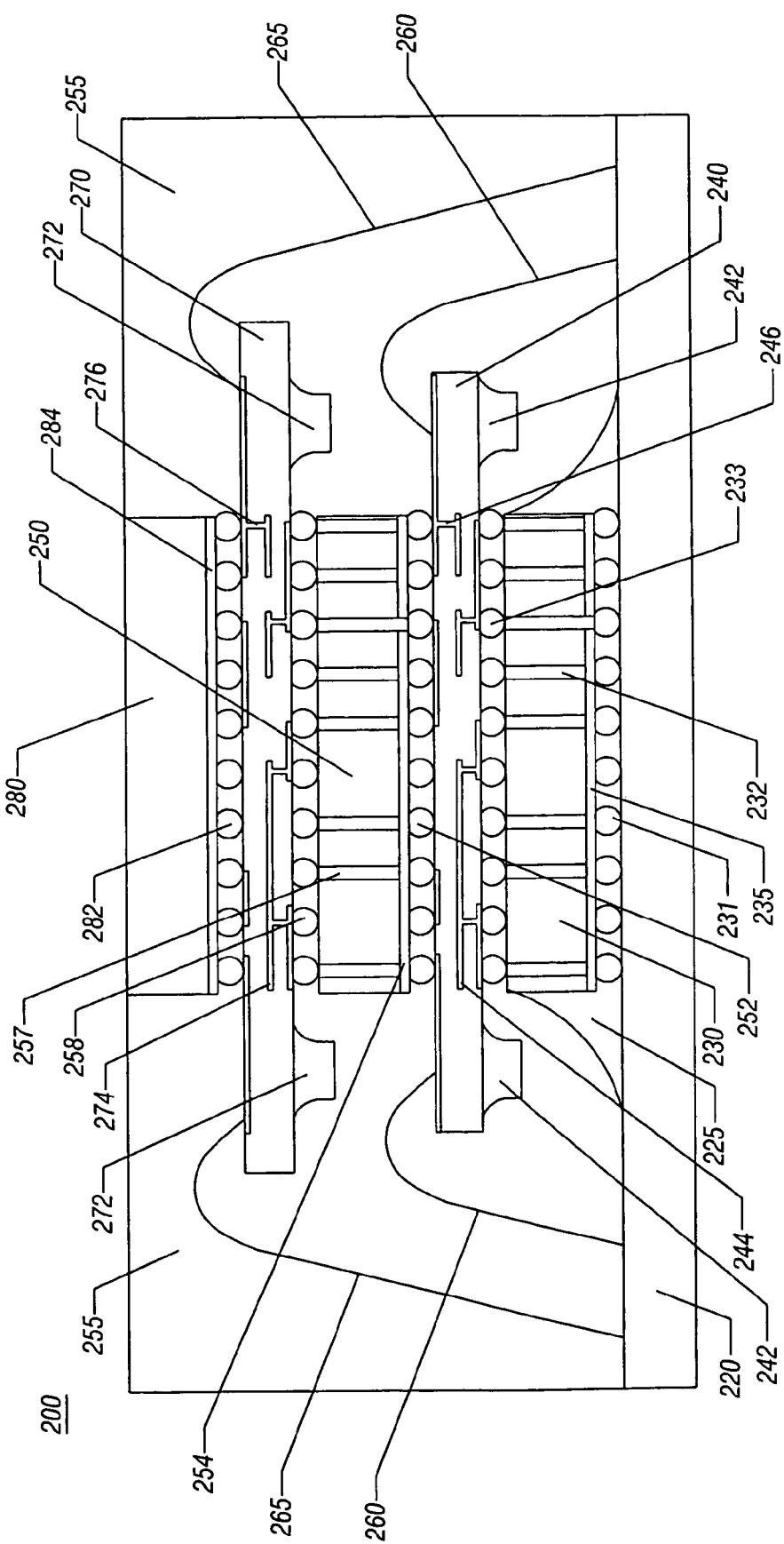
FIG. 3 is a cross-sectional view of a semiconductor package in accordance with yet another embodiment of the present invention.

Still other embodiments are possible. For example, referring now to FIG. 3, shown is a cross-sectional view of a semiconductor package in accordance with yet another embodiment of the present invention. As shown in FIG. 3, three active die are present, namely a first active die 230, a second active die 250, and a third active die 280 (also referred to herein as first die, second die, and third die). By increasing the amount of dies present, greater functionality may be provided in a single package using an embodiment of the present invention.

Still referring to FIG. 3, first die 230 is electrically connected to a substrate 220 with a plurality of solder bumps 231, only one of which is enumerated for ease of illustration in FIG. 3. An underfill material 225 may encapsulate the connections. First active semiconductor die 230 includes a plurality of vias 232, only one of which is enumerated as such in FIG. 3. In various embodiments, vias 232 may provide interconnections through the die from solder bumps 231 or from an active layer 235 of first die 230 to a second set of solder bumps 233 (many of which are shown but only one of which is enumerated as such in FIG. 3). In turn, solder bumps 233 are coupled to a first interface substrate 240, which may be a passive substrate. As shown in the embodiment of FIG. 3, first interface substrate 240 may include various interconnections, including for example, interconnect lines 244 and interconnect vias 246. In this manner, connections may be made to desired circuitry on either of first active die 230 and second active die 250. A plurality of solder bumps 252 may couple first interface substrate 240 with second active die 250, and more particularly to an active region 254 within second active die 250. First interface substrate 240 may include one or more capacitors 242 to provide storage of power for second die 250 and/or first die 230. As further shown in FIG. 3, multiple wire bonds 260 may be coupled from substrate 220 to first interface substrate 240. A mold compound 255 may provide desired stiffness to package 200.

Still referring to FIG. 3, a second interface substrate 270 may be coupled over second active die 250. As shown in the embodiment of FIG. 3, a plurality of solder bumps 258, only one of which is enumerated as such in FIG. 3, may be used to couple second active die 250 with second interface substrate 270. Second active die 250 may include vias 257 to enable interconnections to second interface substrate 270. As shown in FIG. 3, second interface substrate 270 may include various interconnections, including horizontal lines 274 and vertical vias 276. Second interface substrate 270 may also include a plurality of capacitors 272. Furthermore, wire bonds 265 may be coupled to second interface substrate 270. In this manner, power and data connections may be maximized. A plurality of solder bumps 282 may be used to couple second interface substrate 270 with an active region 284 of third active die 280.

In different embodiments, each of first, second, and third die may be various types of semiconductor devices. However, in some embodiments one or more of the active die may correspond to processors such as multicore processors. For example, in one embodiment third die 280 may be a first processor including one or more cores, while second die 250 may be a second processor including one or more cores. Still further, in this embodiment first die 230 may be a chipset for the multiple processors. In another implementation, the chipset may be located at the position of second die 250 and one of the first or second processors may be located at the position of first die 230. In this manner, a single package may accommodate a multiprocessor system, including a chipset. Still further, in other embodiments additional die and intermediate substrates may be implemented. Furthermore, multiple active die may be supported on a single intermediate substrate to improve stacking performance. In one embodiment, one or more of the die may be a memory device such that a single semiconductor package in accordance with an embodiment of the present invention may correspond to a multiprocessor system including at least multiple processors, a memory (e.g., a dynamic random access memory (DRAM)), and a chipset for handling I/O and memory controller functionality.

Using embodiments of the present invention, more and shorter interconnects between active die are provided, enabling reduced inductance and faster communication speeds. Furthermore, by incorporation of one or more intermediate substrates to provide power to closely-coupled semiconductor die, improved power delivery results. That is, capacitors coupled to these intermediate substrates are placed closer to the semiconductor die, improving power delivery and enabling the semiconductor device to operate at a higher frequency, improving performance. Furthermore, such devices may operate at lower voltages due to reduced electrical noise.

Figure 4:
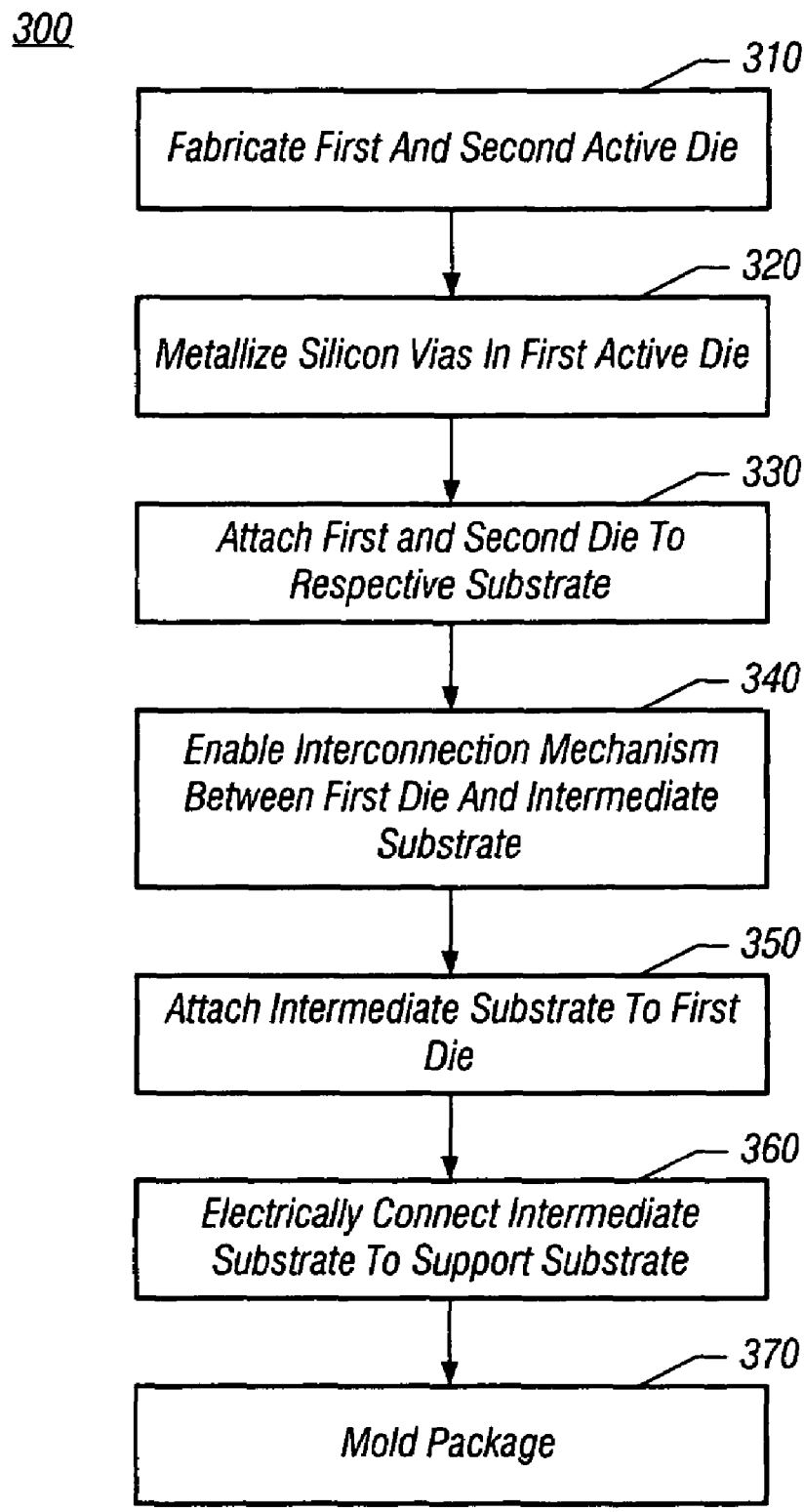
FIG. 4 is a flow diagram of a method of forming a semiconductor package in accordance with an embodiment of the present invention.

Referring now to FIG. 4, shown is a flow diagram of a method of forming a semiconductor package in accordance with an embodiment of the present invention. As shown in FIG. 4, method 300 may begin by fabricating at least two active die (block 310). For example, a processor and chipset each may be fabricated in accordance with standard semiconductor processing techniques. In certain embodiments, these techniques may include additional processing steps, such as performing wafer global thinning of the wafers including the die before the dice are cut.

Next, silicon vias formed in at least the first active die may be metallized (block 320). For example, where the first active die is to be a bottom die of the stacked configuration, silicon vias formed in the first die during fabrication may be metallized, e.g., using an electroplating process such as a copper (Cu) parallel plating process. In this manner, the silicon vias provide for interconnections between a support substrate (and/or areas in the active region of the first substrate) and the backside of the first die.

Still referring to FIG. 4, next the first and second die may be attached to their respective substrate (block 330). The lower die (i.e., the first die) may be attached to a support substrate of the package, e.g., by solder bumps or in another such manner. Similarly, the upper die (i.e., the second die) may be attached to the intermediate substrate, also by way of solder bumps or otherwise. The attachment to the substrates may include further processes, including a substrate flux stencil prior to the die attachment. Then a defluxing process may occur, and a capillary underfill process may be implemented to encapsulate the electrical connections of at least the first die with an underfill material. Next, an interconnection mechanism between the first die and the intermediate substrate may be enabled (block 340). For example, in one embodiment solder bumps may be attached to a backside of the first die to enable the interconnection. However, other manners of interconnecting the first die and the intermediate substrate may be accommodated.

Next, the intermediate substrate may be attached to the first die (block 350). At this point, electrical connections between the intermediate substrate and the support substrate may be made (block 360). For example, a plurality of wire bonds or other electrical connections may be made so that power and/or data can be provided to the intermediate substrate from the support substrate.

Of course in other implementations where additional die are desired to be stacked, similar processes for attachment of additional die to further intermediate substrates and then interconnection of the intermediate substrates containing an attached die to a backside of a current top die may be performed. Finally upon completion of the desired stack, the package may be molded (block 370). Additional steps in completing a semiconductor package, e.g., applying a thermal interface material (TIM) and a cover such as an integrated heat spreader (IHS) may also be performed. Note that while described in the embodiment of FIG. 4 as first attaching each die to a respective substrate, and then joining the substrates including the attached die to a backside of a top die, it is to be understood that the scope of the present invention is not so limited, and in other embodiments a stack may be formed sequentially by attaching intermixed layers of substrates and dies.

Figure 5:
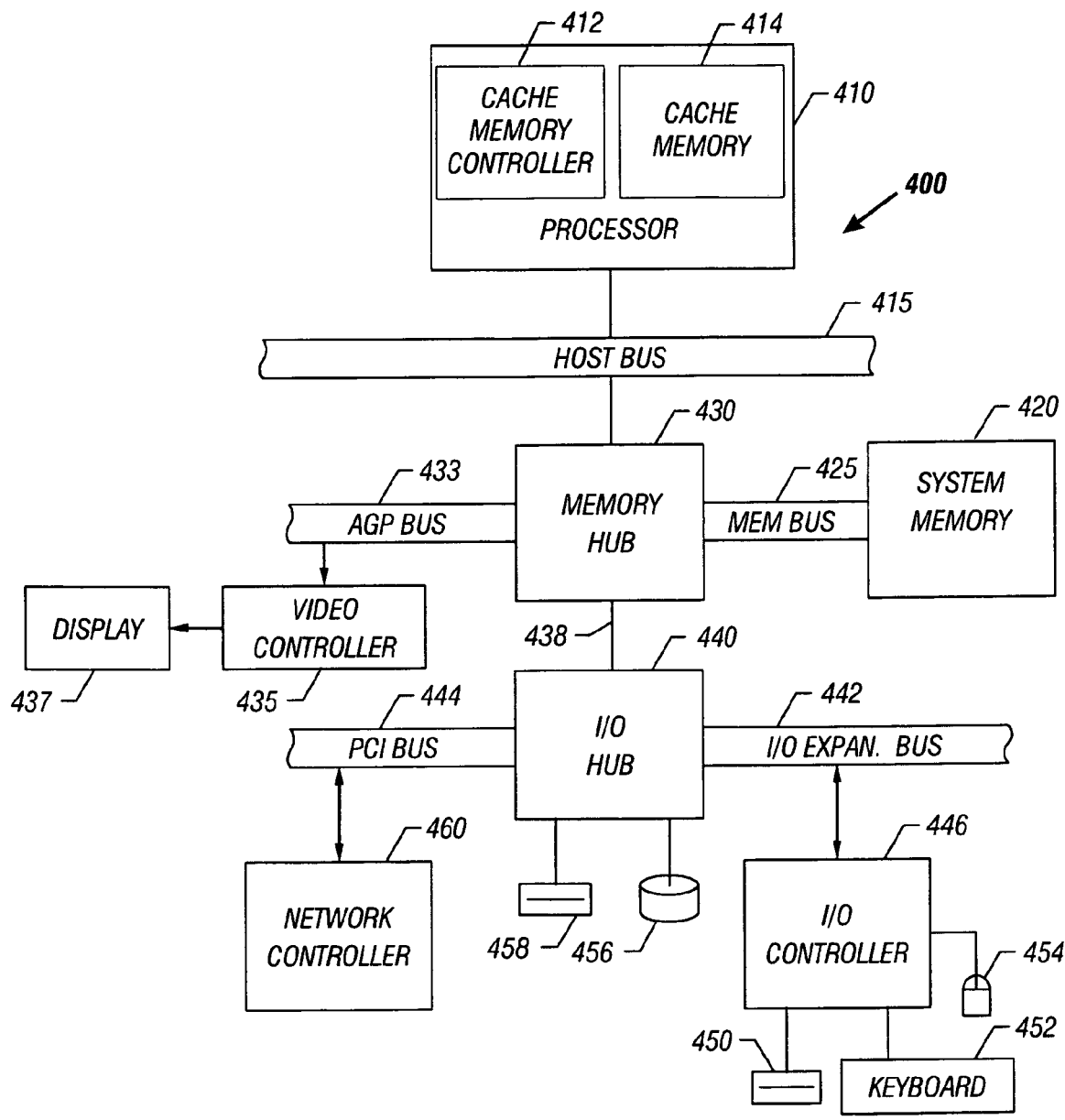
FIG. 5 is a block diagram of a computer system in which embodiments of the invention may be used.

Semiconductor packages in accordance with one embodiment may be used in various systems. FIG. 5 is a block diagram of a computer system 400 in which embodiments of the invention may be used. As used herein, the term "computer system" may refer to any type of processor-based system, such as a notebook computer, a server computer, a laptop computer, or the like.

Now referring to FIG. 5, in one embodiment, computer system 400 includes a processor 410, which may include a general-purpose or special-purpose processor such as a microprocessor, microcontroller, a programmable gate array (PGA), and the like. Processor 410 may include a cache memory controller 412 and a cache memory 414. Processor 410 may be coupled over a host bus 415 to a memory hub 430 in one embodiment, which may be coupled to a system memory 420 (e.g., a dynamic RAM) via a memory bus 425. Memory hub 430 may also be coupled over an Advanced Graphics Port (AGP) bus 433 to a video controller 435, which may be coupled to a display 437.

Memory hub 430 may also be coupled (via a hub link 438) to an input/output (I/O) hub 440 that is coupled to an input/output (I/O) expansion bus 442 and a Peripheral Component Interconnect (PCI) bus 444, as defined by the PCI Local Bus Specification, Production Version, Revision 2.1 dated June 1995. In one embodiment, processor 410, memory hub 430, and I/O hub 440 (at least) may be housed in a single package in accordance with an embodiment of the present invention and coupled, e.g., through a socket to a circuit board of system 400.

I/O expansion bus 442 may be coupled to an I/O controller 446 that controls access to one or more I/O devices. As shown in FIG. 5, these devices may include in one embodiment storage devices, such as a floppy disk drive 450 and input devices, such as a keyboard 452 and a mouse 454. I/O hub 440 may also be coupled to, for example, a hard disk drive 458 and a compact disc (CD) drive 456, as shown in FIG. 5. It is to be understood that other storage media may also be included in the system.

PCI bus 444 may also be coupled to various components including, for example, a network controller 460 that is coupled to a network port (not shown). Additional devices may be coupled to the I/O expansion bus 442 and the PCI bus 444. Although the description makes reference to specific components of system 400, it is contemplated that numerous modifications and variations of the described and illustrated embodiments may be possible.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor package comprising:
   a first semiconductor die including first active circuitry and a plurality of through silicon vias extending from an action region of the first semiconductor die to a backside of the first semiconductor die;
   a second semiconductor die including second active circuitry;
   an intermediate substrate located between the first semiconductor die and the second semiconductor die to provide power to at least one of the first semiconductor die and the second semiconductor die, the intermediate substrate including a plurality of capacitors coupled thereto to store power for at least one of the first semiconductor die and the second semiconductor die;
   a support substrate, wherein the first semiconductor die is attached to the support substrate; and
   a plurality of wire bonds coupled from the support substrate to the intermediate substrate.

2. The semiconductor package of claim 1, wherein the first semiconductor die comprises a chipset for a processor and the second semiconductor die comprises the processor.

3. The semiconductor package of claim 1, further comprising a third substrate, wherein the third substrate is coupled above the second semiconductor die and provides interconnections to the second semiconductor die.

4. The semiconductor package of claim 1, wherein the intermediate substrate includes a plurality of vias to couple the first semiconductor die and the second semiconductor die.

5. The semiconductor package of claim 4, wherein the plurality of vias couple the backside of the first semiconductor die to an active region of the second semiconductor die.

6. The semiconductor package of claim 1, wherein the intermediate substrate comprises passive circuitry to provide power and data interconnections to at least the second semiconductor die.

7. A method comprising:
   attaching an interface substrate to a first semiconductor die of a semiconductor package, the first semiconductor die coupled to a support substrate of the semiconductor package, and attaching a plurality of wire bonds from the support substrate to the interface substrate; and
   attaching a second semiconductor die of the semiconductor package to the interface substrate, wherein the interface substrate is to provide communication between the first semiconductor die and the second semiconductor die.

8. The method of claim 7, further comprising bonding at least one power connection to the interface substrate from the support substrate using at least one of the plurality of wire bonds and coupling at least one capacitor to the interface substrate.

9. The method of claim 7, further comprising attaching a second interface substrate to the second semiconductor die.

10. The method of claim 7, further comprising forming a plurality of vias in the interface substrate.

11. The method of claim 10, wherein the plurality of vias comprise passive circuitry to enable the communication between the first semiconductor die and the second semiconductor die.

12. The method of claim 7, further comprising stacking the interface substrate on the first semiconductor die and stacking the second semiconductor die on the interface substrate.

13. An apparatus comprising:
   a first semiconductor die including chipset circuitry, the first semiconductor die having a plurality of through silicon vias extending from the chipset circuitry to a backside of the first semiconductor die;
   a second semiconductor die including processor circuitry;
   an intermediate substrate located between the first semiconductor die and the second semiconductor die to provide power to at least one of the first semiconductor die and the second semiconductor die, the intermediate substrate having a plurality of metal layers separated by dielectric layers, the intermediate substrate including a plurality of capacitors coupled thereto to store power for at least one of the first semiconductor die and the second semiconductor die;
   a support substrate, wherein the first semiconductor die is attached to the support substrate; and
   a plurality of wire bonds coupled from the support substrate to the intermediate substrate.

14. The apparatus of claim 13, further comprising a second intermediate substrate located above the second semiconductor die, and a plurality of second wire bonds coupled from the support substrate to the second intermediate substrate.

15. The apparatus of claim 14, further comprising a third semiconductor die include processor circuitry supported on the second intermediate substrate, wherein the second and third semiconductor die each include a multicore processor.

* * * * *